United States Patent
Mortimer

(10) Patent No.: US 10,628,618 B2
(45) Date of Patent: Apr. 21, 2020

(54) DRILL BIT DESIGN

(71) Applicant: NOV Downhole Eurasia Limited, Stonehouse, Gloucestershire (GB)

(72) Inventor: Laurence Mortimer, Brockworth (GB)

(73) Assignee: NOV Downhole Eurasia Limited, Stonehouse, Glouchester (GB)

(*) Notice: Subject to any disclaimer, the term of this patent is extended or adjusted under 35 U.S.C. 154(b) by 670 days.

(21) Appl. No.: 14/764,083

(22) PCT Filed: Jan. 21, 2014

(86) PCT No.: PCT/GB2014/050158
§ 371 (c)(1),
(2) Date: Jul. 28, 2015

(87) PCT Pub. No.: WO2014/118507
PCT Pub. Date: Aug. 7, 2014

(65) Prior Publication Data
US 2015/0363544 A1    Dec. 17, 2015

(30) Foreign Application Priority Data
Jan. 29, 2013 (GB) .................................. 1301536.7

(51) Int. Cl.
*G06F 30/17* (2020.01)
*E21B 10/00* (2006.01)
(Continued)

(52) U.S. Cl.
CPC ............... *G06F 30/17* (2020.01); *E21B 4/00* (2013.01); *E21B 10/00* (2013.01); *E21B 10/43* (2013.01);
(Continued)

(58) Field of Classification Search
CPC ........ G06F 17/5086; E21B 10/43; E21B 4/00; E21B 10/55; E21B 10/00; E21B 2010/545; E21B 2010/425; E21B 10/42
See application file for complete search history.

(56) References Cited

U.S. PATENT DOCUMENTS 4,815,342 A * 3/1989 Brett ....................... B23P 15/28
700/159
5,979,570 A * 11/1999 McLoughlin ........... E21B 47/18
175/24
(Continued)

FOREIGN PATENT DOCUMENTS

GB          2422462        7/2006
WO     WO-2010080476    *  7/2010 ............. E21B 10/16

OTHER PUBLICATIONS

Baird et al. "GEODYN: A Geological Formation/Drillstring Dynamics Computer Program" SPE 13023, SPE Annual Technical Conference and Exhibition [retrieved Dec. 15, 2019]. Retrieved from <https://www.onepetro.org/download/conference-paper/SPE-13023-MS?id=conference-paper%2FSPE-13023-MS> (Year: 1984).*
(Continued)

*Primary Examiner* — Rehana Perveen
*Assistant Examiner* — Alfred H B Wechselberger
(74) *Attorney, Agent, or Firm* — Andrus Intellectual Property Law, LLP

(57) ABSTRACT

A drill bit (10), for example of a fixed cutter type, comprises at least one structure, for example a blade, having first and second rows of cutters (35*a-h*) thereon. The first row is configured to achieve suitable performance when the drill bit drills in concentric mode. The second row of cutters is configured to improve the performance of the first row of cutters when the drill bit drills in eccentric mode. For example, the second row increases depth of cut and wear (Continued)

resistance in eccentric mode drilling. The drill bit may be mounted on a bent motor (120) used in directional drilling.

14 Claims, 8 Drawing Sheets

(51) Int. Cl.
    *E21B 4/00*     (2006.01)
    *E21B 10/43*     (2006.01)
    *E21B 10/55*     (2006.01)
    *E21B 10/42*     (2006.01)
    *E21B 10/54*     (2006.01)

(52) U.S. Cl.
    CPC ........ *E21B 10/55* (2013.01); *E21B 2010/425* (2013.01); *E21B 2010/545* (2013.01)

(56) References Cited

U.S. PATENT DOCUMENTS

| | | | | |
|---|---|---|---|---|
| 6,779,613 B2* | 8/2004 | Dykstra | ................ | E21B 10/42 |
| | | | | 175/428 |
| 7,287,604 B2* | 10/2007 | Aronstam | ............... | E21B 7/062 |
| | | | | 175/61 |
| 7,844,426 B2* | 11/2010 | Huang | ................... | E21B 44/00 |
| | | | | 703/6 |
| 8,079,430 B2* | 12/2011 | Huynh | ................... | E21B 7/067 |
| | | | | 175/426 |
| 9,309,723 B2* | 4/2016 | Schwefe | ................. | E21B 10/43 |
| 9,864,821 B2* | 1/2018 | Chen | ...................... | E21B 10/43 |
| 2007/0005316 A1 | 1/2007 | Paez | | |
| 2007/0032958 A1 | 2/2007 | Chen | | |
| 2007/0192074 A1* | 8/2007 | Chen | ........................ | E21B 7/04 |
| | | | | 703/10 |
| 2009/0055135 A1* | 2/2009 | Tang | ...................... | E21B 10/00 |
| | | | | 703/1 |
| 2009/0107730 A1 | 4/2009 | Green | | |
| 2010/0324825 A1* | 12/2010 | Detournay | .............. | E21B 10/00 |
| | | | | 702/6 |
| 2011/0240376 A1* | 10/2011 | Chen | ...................... | E21B 10/43 |
| | | | | 175/336 |
| 2012/0046869 A1* | 2/2012 | Propes | ................... | E21B 7/067 |
| | | | | 702/9 |
| 2013/0248256 A1* | 9/2013 | Spencer | ............. | G06F 17/5009 |
| | | | | 175/342 |
| 2015/0122551 A1* | 5/2015 | Chen | ...................... | E21B 10/43 |
| | | | | 175/426 |
| 2015/0152689 A1* | 6/2015 | Chen | ...................... | E21B 10/43 |
| | | | | 175/412 |
| 2017/0058658 A1* | 3/2017 | Spencer | ............. | G06F 17/5004 |

OTHER PUBLICATIONS

Search Report for GB1301536.7 dated Jul. 22, 2014.
International Search Report for PCT/GB2014/050158 dated Jul. 2, 2014.

* cited by examiner

| Inputs | | | | Output Values | |
|---|---|---|---|---|---|
| Motor Data | | | | | Overview of System |
| Motor Bend Angle A | degrees | 2.12 | | Component in Contact (For middle contact) | Bend Knuckle |
| | radians | 0.03700098 | | Actual Motor Angle | 2.12 deg |
| | inches | mm | | Minimum Borehole OO | 249.9446342 mm |
| Bit to Centre of Front Stabiliser Blade | 28 | 711.2 | | Dog Leg Severity | 11.13961052 deg/100ft |
| Bit to Pin face To Bend Distance | 77 | 1955.8 | | | |
| Overall Motor Length | 328 | 8331.2 | | Motor Model Adjustments | |
| Knuckle Radius (/at adjusting ring) | 3.5 | 88.9 | | Rotational Axis Displacement from Joint centre | 36.0723171 mm |
| Motor Diameter | 6.25 | 158.75 | | Joint to Rear Pipe Angle B | 0.483633836 deg |
| | | | | Joint to Front Pipe Angle C | 1.636366164 deg |
| Bit Data | inches | mm | | Slide Rot. Z Displacement | -2587.745247 mm |
| Bit Pin Top to UCS Point | 10.32 | 262.128 | | Slide Rot. Y Displacement | 156661.4127 mm |
| Bit Diameter | 7.875 | 200.025 | | Sliding Arc Radius | 156771.9714 mm |
| Bit Pin Top to Top of Gauge | | 182.9 | | | |
| Gauge Length | 3 | 76.2 | | Data For Bottom Hole Pattern Creation | |
| Bend to Bit UCS Point | 87.32 | 2217.928 | | Bottom Hole Pattern Offset | 27.26304533 mm |
| Gauge Taper Angle - one side | degrees | radians | | Bit Angle | 1.636366164 deg |
| | 0.6 | 0.010471976 | | Bit cross over length | 954.3296 mm |
| Rear Staab Data | inches | mm | | | |
| Rear Stab Diameter | 7.75 | 196.85 | | Save Motor Parameters | |
| Rear Stab Centre to Corner L8 | | 1043.61 | | | |
| Rear Stab Blade Length | | 384.175 | | View Diagram | |
| Front Stab Data | inches | mm | | | |
| Front Stab Diameter | 7.75 | 196.85 | | | |
| Front Stab Centre to Corner | 2.55 | 64.77 | | | |

Fig. 5

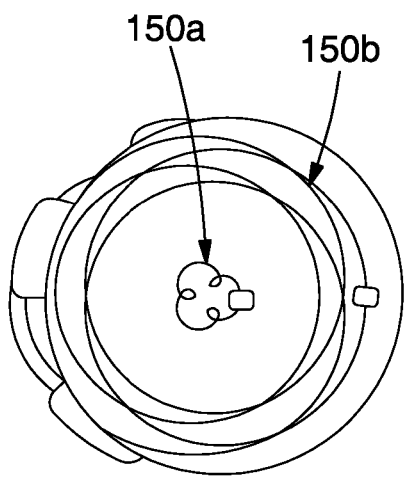
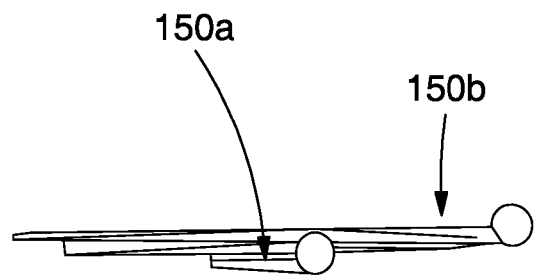
Fig. 7A
Fig. 7B
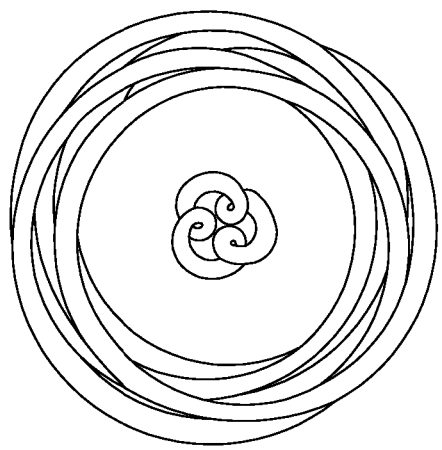
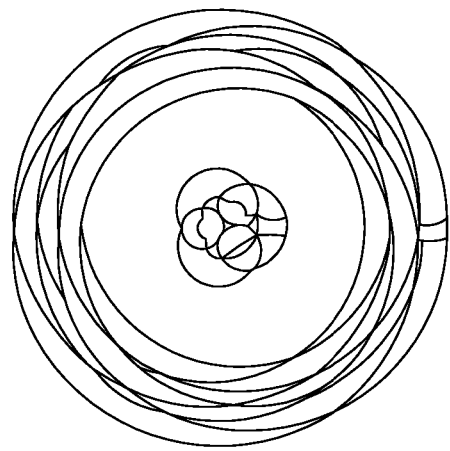
Fig. 8A
Fig. 8B

DRILL BIT DESIGN

CROSS REFERENCE TO RELATED APPLICATIONS

The present application is the U.S. national stage application of International Application PCT/GB2014/050158, filed Jan. 21, 2014, which international application was published on Aug. 7, 2014, as International Publication WO2014/118507. The International Application claims priority of British Patent Application 1301536.7, filed Jan. 29, 2013, the contents of which are Incorporated herein by reference in their entireties.

BACKGROUND

Drilling wells in oil and gas reservoirs is a lengthy operation, in some cases, lasting over a month for a single well. In addition, drilling, for example offshore, is performed in difficult and hazardous conditions; it mobilizes equipment that is complex and expensive. To reduce the cost associated with the exploration or exploitation of oil and gas reservoirs, drillers are pressed to drill wells faster and increase the yield of the drilling equipment. In some places, increasing the rate of penetration (or "ROP") of a drill string through the reservoir and reducing the frequency at which the drill string is removed from the well to replace a worn drill bit have become a necessity to make oil or gas extraction economical.

Several components of a drill string may be optimized to achieve a higher ROP. The drill bit is one of these components: improving its aggressivity, its stability, as well as its durability has significant impact on the speed at which wells may be drilled. Examples of efforts to improve drill bit performances are shown in U.S. Pat. Nos. 5,551,522, 5,582,261, 5,549,171. Further, certain types of rocks may present unique challenges for improving drill bit performance. Examples of efforts to improve drill bit performances in plastic shales, one of the rocks encountered near or in oil and gas reservoirs, are described in U.S. Pat. No. 6,564,886.

Methods of designing drill bits for increased performance may involve estimating the trajectory of cutter elements mounted on a rotating drill bit, as well as the bottom hole pattern (or "BHP") resulting from this trajectory. In cases where the drill bit and the wellbore axis are essentially collocated, sometimes referred to as concentric drilling cases, the BHP is relatively easy to estimate. In contrast, in cases where the drill bit and wellbore axis are tilted and/or offset, sometimes referred to as eccentric drilling cases, the BHP is more difficult to estimate. An example method of designing drill bits that involves estimating the BHP is shown in U.S. Pat. No. 7,844,426 and one that accounts for drilling in eccentric mode in U.S. Pat. No. 7,860,693. More recently, U.S. Pat. App. Pub. No. 2012/0046869 discloses methods that rely on mathematical approximations of the trajectory of the cutters in the eccentric mode to estimate the BHP. In the current state of the art, few methods account for drilling in the eccentric mode, and the performance of drill bits operating at least partially in eccentric mode, typically drill bits mounted on a rotatable bent motor, remains mediocre.

SUMMARY

Those skilled in the art will readily recognize that the present disclosure and its accompanying figures introduce a bottom hole assembly (or "BHA") comprising a drill bit mounted on a rotatable bent motor. The drill bit, for example a fixed cutter drill bit, comprises a plurality of cutters, such as polycrystalline diamond compacts (or "PDC"). The plurality of cutters may comprise at least a first row of cutters, herein referred to as primary cutters, affixed to and protruding from a blade of the drill bit, and a second row of cutters, herein referred to as secondary cutters, affixed to and protruding from the same blade. The second row may be located behind the first row relative to the direction of rotation of the drill bit. The cutters of the first row may be sized, oriented and/or located using a known or future-developed method to achieve a suitable performance of the drill bit during concentric drilling, i.e., when the bent motor is not rotated. The cutters of the second row may be sized, oriented and/or located using the bottom hole pattern (or "BHP") generated by the cutters of the first row in an eccentric drilling case. Thus the sizes, orientations and/or locations of the cutters of the second row may be determined as a function of the geometry of the bent motor and the ratio of the rotation speed of the drill bit by the one of the bent motor. For example, the sizes, orientations and/or locations of the cutters of the second row may be selected to achieve a deeper depth of cut (or "DOC") in eccentric drilling cases than the DOC achievable with only the cutters of the first row. In other words, the sizes, orientations and/or locations of the cutters of the second row may be selected to reduce or limit rubbing of the blades in an eccentric drilling case. Another benefit is that the cutters of the second row may be selected, positioned, orientated, etc, so as to achieve a reduction in the wear of the cutters of the first row in eccentric drilling cases. The cutters of the second row may be offset from the radial locations of the cutters of the first row. In some embodiments, the cutters of the second row may play no part in rock cutting when in concentric drilling. In some embodiments, the cutters of the second row are not tracking the cutters of the first row in eccentric drilling cases.

The present disclosure and its accompanying figures also introduce methods of designing a bottom hole assembly (or "BHA"). The methods may comprise selecting a configuration of a row of primary cutters for achieving suitable performance of the drill bit in concentric drilling cases, estimating a bottom hole pattern (or "BHP") generated by the primary cutters in eccentric drilling cases, and selecting a configuration of a row of secondary cutters based on the bottom hole pattern. The rows of both primary and secondary cutters may be located on one blade of a drill bit of the BHA. The BHA may include a bent motor, and the BHP in eccentric drilling mode may be parameterized by a bent angle of the motor, the positions of stabilizers on the motor housing, the diameter of the stabilizers, and the distances between the drill bit and the centralizers, among other parameters. Selecting the configuration of the row of secondary cutters may include identifying zones of blade rubbing on the BHP and adding at least one secondary cutter to alleviate blade rubbing.

DRAWINGS

The present disclosure is best understood from the following detailed description when read with the accompanying figures.

FIG. 5 is a snapshot of a graphical interface of a bottom hole assembly configuration calculator (or "BCC") according to one or more aspects of the present disclosure.

FIGS. 7A and 7B are graphs of path curves of cutters according to one or more aspects of the present disclosure.

FIGS. 8A and 8B are graphs of cutter bottom hole patterns according to one or more aspects of the present disclosure.

Figure 9A:
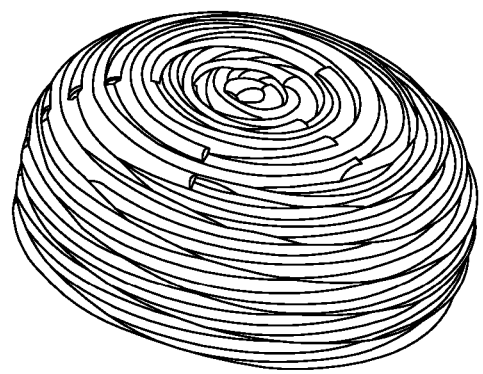
Figure 9B:
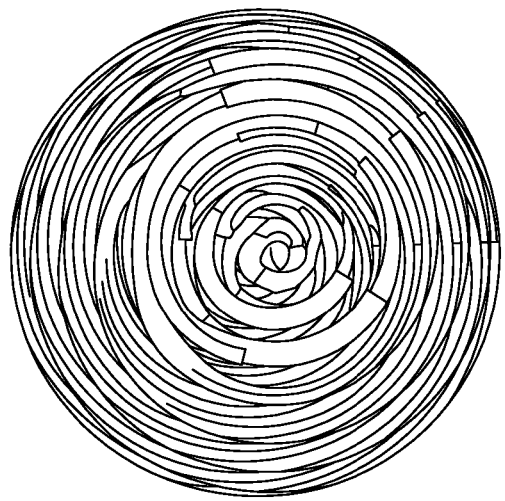
Figure 9C:
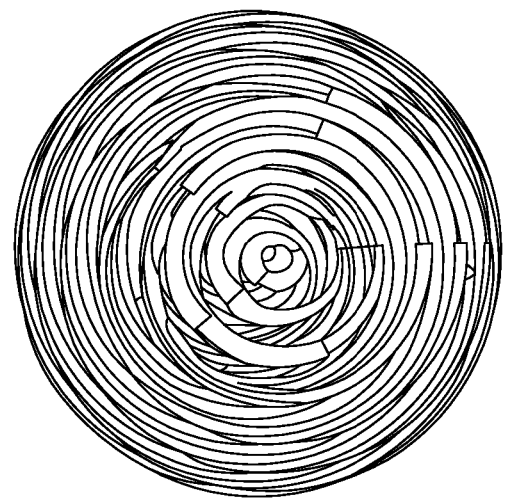

FIGS. 9A, 9B, and 9C illustrates steps of analysis of bottom hole patterns according to one or more aspects of the present disclosure.

Figure 1:
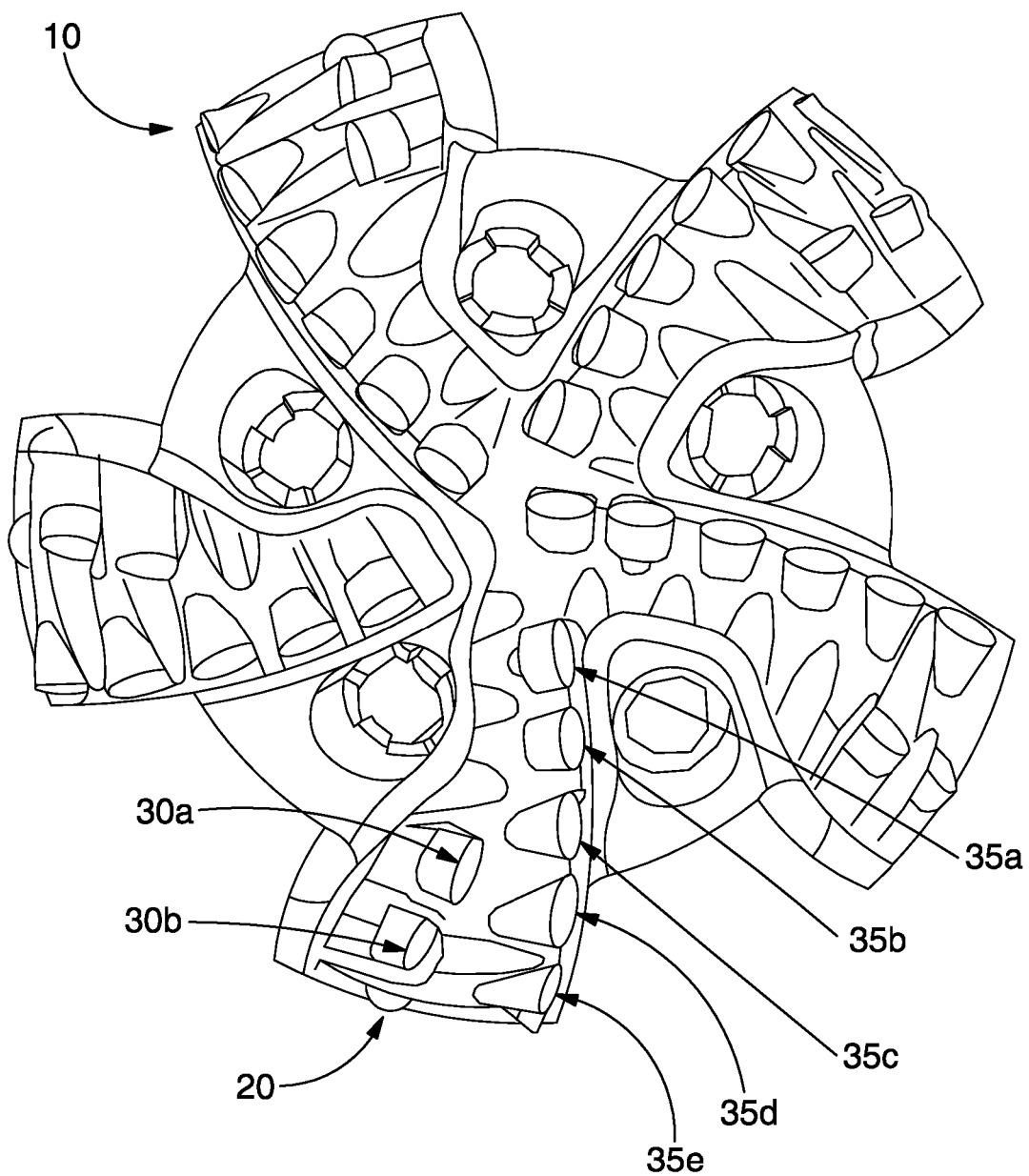
FIG. 1 is a bottom view of a drill bit according to one or more aspects of the present disclosure.
Figure 10:
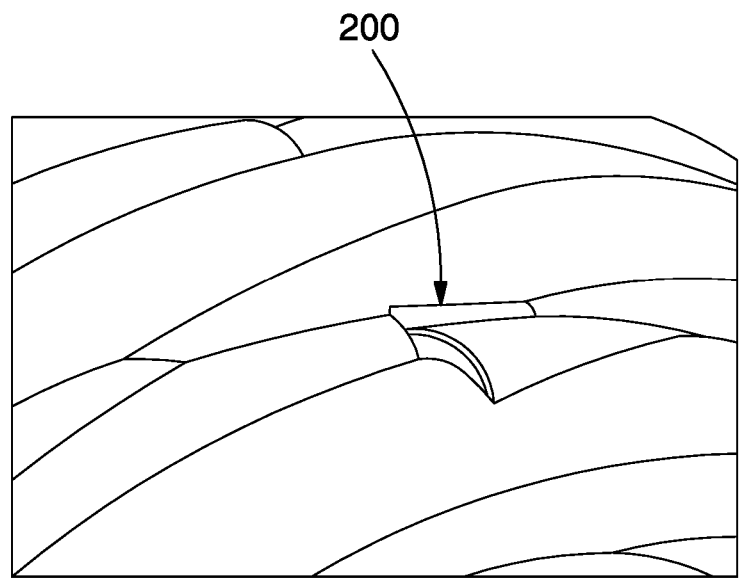

FIG. 10 is a view of the bottom hole pattern generated by primary cutters of the drill bit shown in FIG. 1.

Figure 11:
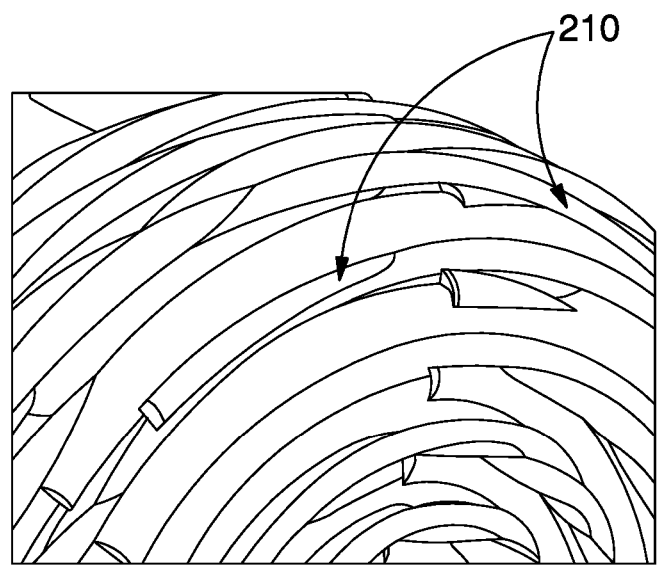

FIG. 11 is a view of the bottom hole pattern generated by primary and secondary cutters of the drill bit shown in FIG. 1.

DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The methods disclosed herein regarding three dimensional simulation (or "3D simulation") of bent motor BHAs provide the means to generate the BHP of a drill bit mounted on a bent motor BHA when drilling in rotational mode. First, the movement of the drill bit is simulated in 3D space. Then, the BHP generated by a selected portion of the cutting structure of the drill bit may be visualized using the BHP creator described herein. The BHP is assembled such that it is stationary and as the BHA rotates and moves forward, the cutting structure of the bit tracks the BHP. For example, two BHPs may be used; one to simulate the previous BHP relating to one complete rotation of the string and one to simulate the next stage of the BHP created as the BHA moves forward another complete revolution. The BHP creator may be set to progress at certain time intervals relating to specific degrees of rotation of the string or bit to aid visualization and analysis. As part of the 3D simulation, the BHP completed by the entire cutting structure may be assembled into an overall computer assisted design assembly (or "CAD assembly").

Figure 2:
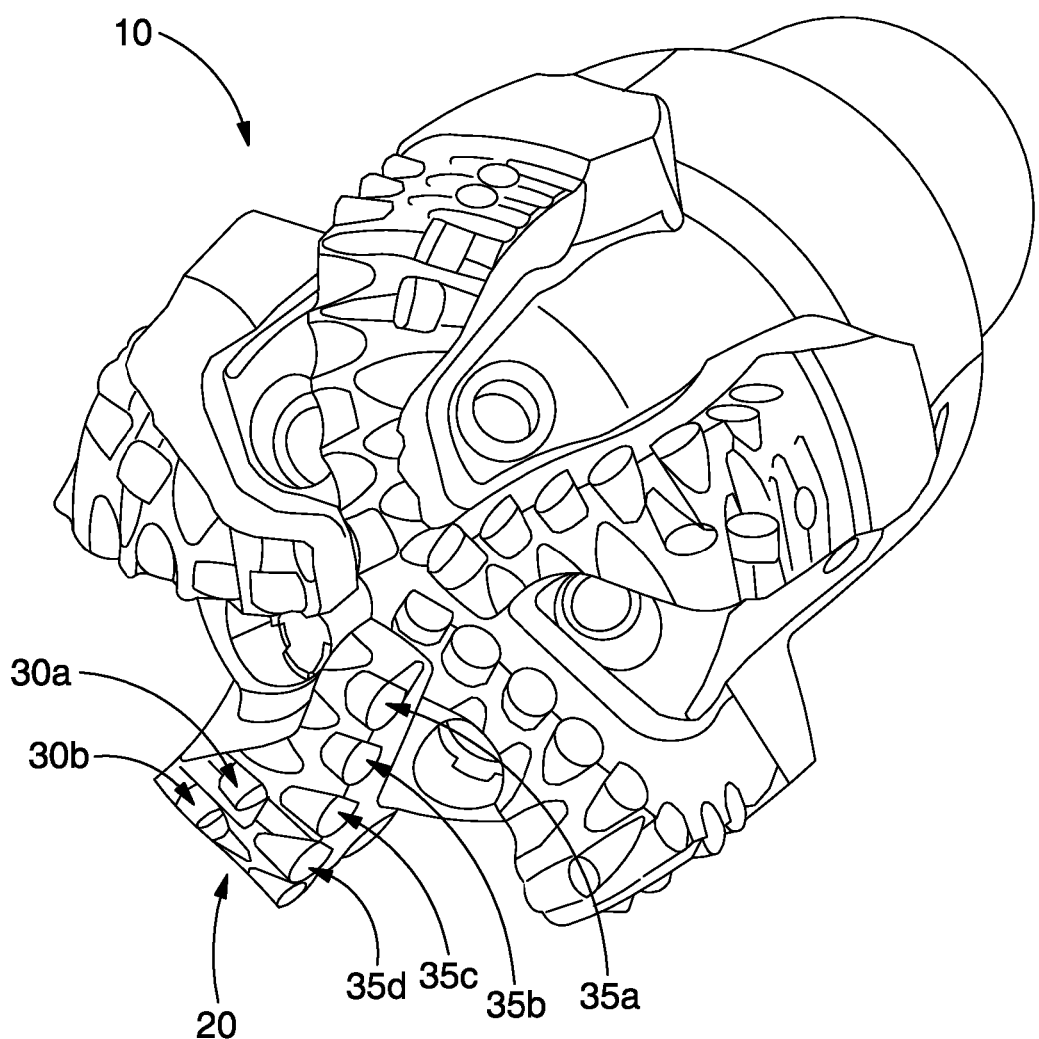
FIG. 2 is a perspective view of the drill bit shown in FIG. 1.
Figure 3:
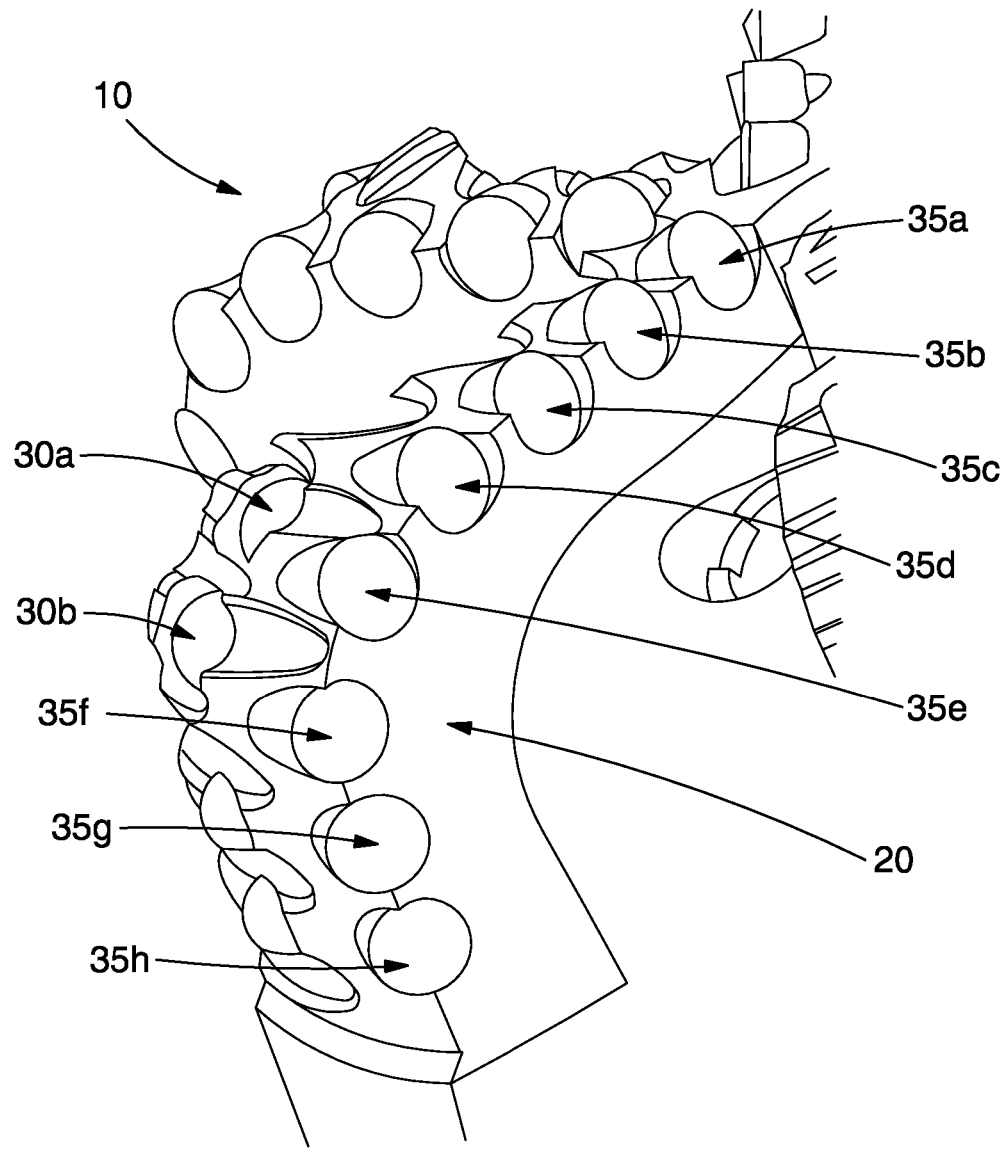
FIG. 3 is a perspective view of a portion of the drill bit shown in FIGS. 1 and 2.

FIGS. 1, 2 and 3 show the placement of secondary cutters (e.g., row of cutters 30a and 30b) and to improve the DOC of a fixed cutter bit 10 usable for bent motor applications. As may be seen, there are two secondary cutters per blade (e.g., blade 20). In contrast with prior art designs where the use of secondary cutters up tracks directly behind the primary cutters (e.g., row cutters 35a, 35b, 35c, 35d, 35e, 35f, 35g, 35h) when drilling concentrically, the secondary cutters may be placed between the primary cutters of the same blade.

Unlike some known bits in which the configuration of the secondary cutters is only based on increasing wear resistance properties of the bit, the secondary cutters (e.g., row of cutters 30a and 30b) of the bit 10 are also positioned to improve the BHP created by the bit when rotating on a bent motor BHA in rotational (i.e., non-sliding/non-concentric) drilling mode. In other words, the placement of the secondary cutters may be primarily selected to improve the BHP when drilling in rotational mode on a bent motor. These secondary cutters may be placed such that when in sliding or concentric drilling mode they play no or little part in the cutting process (within pre-determined range DOCs) and hence do not slow down the bit when sliding. Optionally, the location of the secondary cutters may be selected to ensure they are not tracking the primary cutters.

The bit 10 may be designed the following way. The configuration, that is, the position, size, orientation and/or other geometric parameters of the primary cutters (e.g., the cutters 35a, 35b, 35c, 35d, 35e, 35f, 35g, and 35h) may be selected. Having created the BHP equipped with a cutting structure consisting of the primary cutters only, not only may a designer analyze each cut shape of each cutter of the bit, but also look for blade rubbing that occurs at the face of the bit body and or gauge areas. Having conducted the three dimensional simulation (or "3D simulation) and analysis of bent motor BHAs, it became apparent that the BHP created by the bit when in non-sliding mode was very much different to that when sliding or rotating concentrically. This meant that the BHP at certain regions of the bit became heavily dependent on blade count/rotational separation and bent motor BHA parameters. Under certain drilling parameters the BHP may encroach into the blade tops of the bit body even when maximum cutter exposure is achieved when relying solely on the primary cutting structure.

It was found that by placing secondary cutters on each or some blades, it was possible to improve the BHP in order to avoid blade rubbing at the regions of interest, increasing DOC and hence ROP. The analysis BHP in eccentric drilling may thus lead to a second design iteration in which secondary cutters placement improves performance in bent motor applications. The secondary cutters may be placed such that they remove additional rock in particular regions where otherwise blade rubbing would be encountered if relying solely on the primary cutting structure. This blade rubbing would then impede DOC reducing ROP. Thus, by properly placing the secondary cutters, deeper DOC to be achieved based on being. For example the secondary cutters (e.g., the cutters 30a and 30b) may be positioned between the primary cutters and offset from the tip profile in order to remove a volume of rock depending on the drilling parameters (e.g., the ROP, the ratio of the rotation speed of the drill bit by the one of the bent motor) and configuration of the BHA (e.g., the bent angle of the motor, the positions of stabilizers on the motor housing, the diameter of the stabilizers, and the distances between the drill bit and the centralizers).

Figure 4:
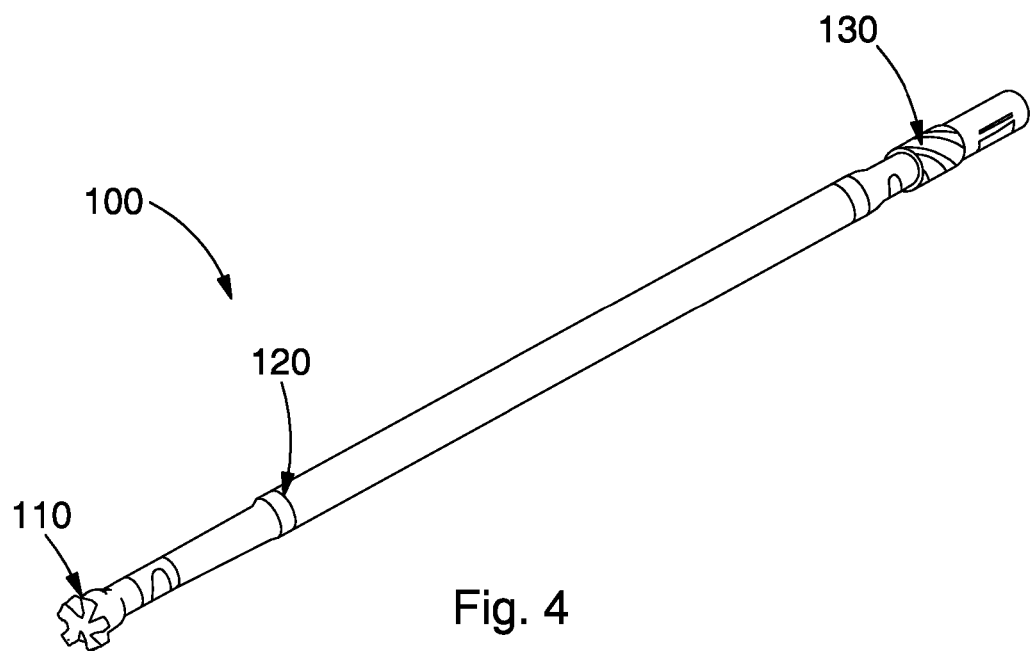
FIG. 4 is a view of a bottom hole assembly having a bent motor according to one or more aspects of the present disclosure.

FIGS. 5, 7A, 7B, 8A, 8B, 9A, 9B and 9 C relate to 3D dynamic 3D simulation of a bent motor BHA, such as BHA 100 shown in FIG. 4 whilst in rotational drilling mode, as well as sliding drilling mode. The methods described herein may also allow the analysis of the cutting structure and provide a visual understanding of behavior of the complete BHA including components such as the bit, the bent motor and other stabilizers. The methods not only may be used to simulate the BHA but also to produce the trace curves for each cutter of the cutting structure of the bit, and to simulate the BHP produced by the bit cutting structure in the rock when mounted on the bent BHA under various run parameters. The simulation involves a 3D simulation of the BHA and the incorporation of the BHP overlaid on the simulation to check cutter interactions or other interactions with the rock, including interactions of the bit body, motor and stabilizers. The methods provided herein provide means to predict bit tilt and bit center to wellbore center distance used in turn to estimate trajectories of the various BHA components.

The 3D simulation may include the following main components: a BHA configuration calculator (or "BCC"), a BHA master simulator, and a BHP creator. The BCC allows the user to enter the BHA configuration in terms of the motor data along with the bit data and stabilizer data. A text file may then be outputted from the BCC and fed into the master BHA simulator to create a specific BHA configuration in the wellbore. The shown example utilizes ProE CAD but the method is by no means restricted to ProE and could be implemented on any equivalent CAD package. A simulated BHP may also be created based on the outputs of the BCC along with the specific drilling parameters under consideration in terms of DOC (or ROP), RPM ratio between bit and drill string. The BHP creator allows the user to step through various rotational angles of the bit whilst drilling allowing for analysis at various rotational angles of interest. The BHP may be color coded to highlight the cutters on each blade. The BHP generates a path for each cutter of the bit as a function of the drilling parameters. The BHP creator may be easily modified by changing parameters within the algorithms.

The graphical interface of the BCC is shown in FIG. 5. The BCC takes in motor data (e.g., the data describing the geometry of the bent motor 120 shown in FIG. 4, that is dimensions, bent angle etc. . . . ), bit data (e.g., the data describing the geometry of the drill bit 110 shown in FIG. 4), stabilizer data (e.g., the dimensions and positions data describing the geometry of the stabilizers 130 in FIG. 4). The basis of the BCC may be the three points of contact method which is widely used in the industry although not necessarily to the detail of the BCC. For rotational drilling (i.e., eccentric drilling), the BCC calculates the three points of contact on the bit, motor and stabilizer. These parameters establish the configuration of the BHA (e.g., the BHA 100 shown in FIG. 6) when drilling in the rotational mode. The BCC establishes the rotational wellbore diameter (e.g., the diameter of wellbore 140 shown in FIG. 6). The BCC also determines the bit tilt and offset distance. For sliding drilling (i.e., concentric drilling), the BCC calculates the three points of contact and the dogleg severity (or "DLS") in order to analyze the BHA in sliding mode as well. The driving dimensions may then be outputted to the master BHA simulator to drive the common assembly model for both rotational and sliding simulation.

Figure 6:
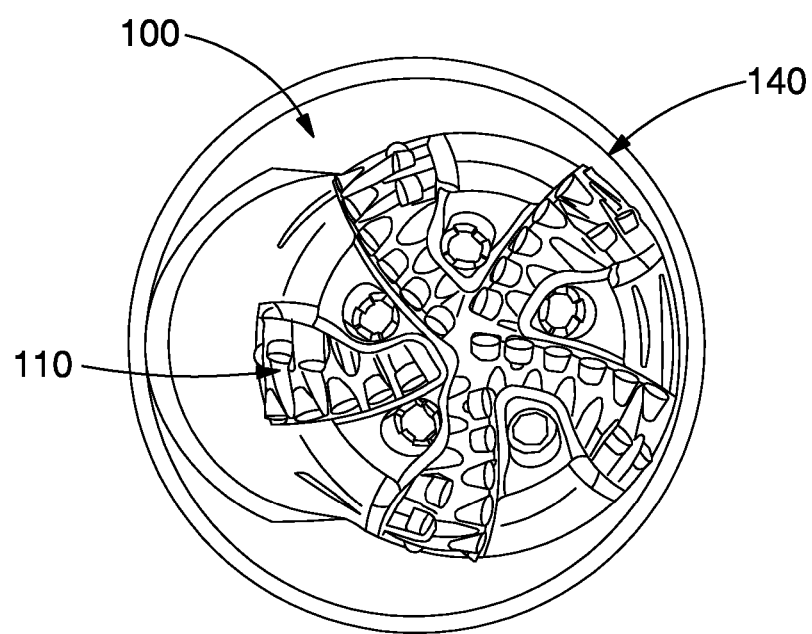
FIG. 6 is a bottom view of the configuration of the bottom hole assembly shown in FIG. 4 in a wellbore.

The master BHA simulator utilizes as input from the calculations generated by the BCC and visualizes the studied BHA (e.g., the BHA 100 shown in FIG. 6) within the predicted wellbore diameter (e.g., the wellbore 140 shown in FIG. 6). The master BHA simulator may be configured via drilling parameters (e.g., mud flow rate through the motor, motor power curve, ROP) in terms of rotation speed of the drill bit in rounds per minute (or "RPM"), rotation speed of the BHA, and axial DOC. Once configured, the drilling visualization may then be driven using the mechanism program within the CAD system. The drilling simulation may provide the user with a wealth of visual understanding of the dynamics of the various components making up the BHA, especially the dynamics of the bit and its cutting structure. For example as shown in FIG. 6, the BHA 100 may be visualized confined within the predicted wellbore 140. The drilling simulation may help the user to understand how the bit 110 generates the effective wellbore 140 which is larger than the diameter of the bit 110. Traced curves may be created at various points of interest on the BHA to build up a better understanding of the dynamic behavior. The dynamics of the bit may also be used to understand the trajectories of components of the cutting structure, for example, cutter paths (e.g., paths 150a and 150b shown in FIGS. 7A and 7B). This capability can be used as a double check between the master BHA simulator and the BHP creator.

Whilst the traced curves produced by the master BHA simulator may be used to generate the cutter path curves for each of the cutters of the bit, this method may prove to be very time consuming. Therefore, the BHP creator may be used to replicate the true drilling trajectory of the bit and generate therefrom the path of all or any of the cutters on a fixed cutter bit. For example, the BHP creator may be used to produce path curves for cutters of specific interest. As shown in FIGS. 8A and 8B, top and bottom views of example curves equivalent to paths 150a and 150b shown in FIGS. 7A and 7B are produced.

FIGS. 9A, 9B, and 9C illustrate steps in the creation and analysis of a complete BHP (including the entire cutting structure of the bit) according to the present disclosure. The BHP creator utilizes the calculations generated by the BCC, as well as the configuration of the cutters on the bit (cutter positions in a coordinate system bound to the bit, cutter sizes, cutter orientations, etc . . . ) for the bit being analyzed. The BCC creator generates the complete BHP based on this input. The completed BHP (e.g., the BHP shown in FIG. 9A) may then be assembled back with the drilling simulation into master BHA simulator as part of the visualization of the drilling dynamics. The BHP is assembled such that it is stationary and as the BHA rotates and moves forward, the cutting structure of the bit tracks the BHP.

Generally two BHPs are used to analyze the cutting structure: one to simulate the previous BHP relating to one complete rotation of the string (e.g., FIG. 9A) and one to simulate the next stage of the BHP created as the BHA moves forward another complete revolution. The BHP creator may be set to progress at certain time intervals relating to specific degrees of rotation of the string or bit to aid visualization and analysis as shown in FIGS. 9B and 9C. Having created the two BHPs, the user may not only analyze each cut shape of each cutter of the bit but also look for blade rubbing that occurs at the face of the bit body and/or gauge areas.

Blade rubbing in eccentric drilling mode is known to impede DOC and reduce ROP. Blade rubbing analysis was conducted as part of the design of the drill bit shown in FIGS. 1, 2 and 3, and may be used generally for designing drill bit product lines specific for drilling application utilizing bent motors. The BHP analysis shown in FIGS. 10 and 11 exemplifies a method of secondary cutters placement for bent motor applications. The secondary cutters allow for deeper DOC to be achieved. For example, the secondary cutters are placed such that they remove additional rock in particular regions where blade rubbing would otherwise be encountered if relying solely on the primary cutting structure.

FIG. 10 shows the BHP with the primary cutters but without the secondary cutters, and a blade rubbing are 200 (in brown) appearing for a particular value of DOC. FIG. 11 shows the BHP with the primary and secondary cutters, and the additional volume 210 cut by the secondary cutters. There is no blade rubbing for the same value of DOC.

The 3D simulation conveniently further includes the steps of simulating the effects of transitioning from the rotational drilling mode to the sliding drilling mode, and subsequently transitioning back to the rotational drilling mode. It may further allow sculpting or shaping of the blade profile of the bit to allow optimization of DOC and/or blade rubbing when mounted upon a bent motor.

Whilst in the description hereinbefore the secondary cutters are selected and positioned to avoid or reduce blade rubbing issues, the choice of cutter size, type, position, etc, may alternatively or additionally be made to allow improvements in the wear characteristics of the bit by spreading the drilling loads more uniformly, and/or to achieve enhancements in the depth of cut and/or rate of penetration.

Although described in terms of rows of cutters, it will be appreciated that other configurations are possible without departing from the scope of the invention.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. A method of designing a bottom hole assembly, comprising:
    selecting a configuration of primary cutters on a drill bit of the bottom hole assembly for achieving suitable performance of the drill bit in concentric drilling cases;
    estimating, by performing a simulation of movement in three-dimensional space of the drill bit upon which the primary cutters are provided, a bottom hole pattern generated by the drill bit having the primary cutters in eccentric drilling cases, and providing trace curves for each primary cutter; and
    selecting a configuration of secondary cutters based on the bottom hole pattern, the selecting comprising estimating, by performing a simulation of movement in three-dimensional space of the drill bit upon which the primary cutters and the secondary cutters are provided, a bottom hole pattern generated by the drill bit having the primary cutters and the secondary cutters in eccentric drilling cases, and providing trace curves for each of the primary and secondary cutters, wherein the secondary cutters are for use in eccentric drilling, and wherein the selected configuration places the secondary cutters such that when the bottom hole assembly is operated in sliding or concentric drilling mode, the secondary cutters play a substantially minimized part in a cutting process performed by the bottom hole assembly in the sliding or concentric drilling mode; and
    creating a bottom hole assembly having primary cutters in the selected configuration and secondary cutters in the selected configuration for use in both concentric and eccentric drilling cases.

2. The method of claim 1, wherein the bottom hole assembly includes a bent motor and a stabilizer provided on the motor housing, and wherein the bottom hole pattern in an eccentric drilling mode is parameterized by at least one parameter from the group consisting of a bent angle of the motor, a position of the stabilizer, a diameter of the stabilizers, and a distance between the drill bit and the centralizer.

3. The method of claim 1, wherein selecting the configuration of secondary cutters comprises identifying a zone of blade rubbing on the bottom hole pattern and adding at least one secondary cutter to reduce or limit blade rubbing.

4. The method of claim 1, wherein selecting the configuration of secondary cutters comprises providing secondary cutters on a blade of a drill bit where primary cutters are provided.

5. The method of claim 1, wherein the selected configuration of primary cutters comprises a first row of cutters on a blade of a drill bit.

6. A bottom hole assembly comprising a bent motor and a drill bit, wherein the bottom hole assembly is designed according to the method of claim 1.

7. The method of claim 5, wherein the selected configuration of secondary cutters comprises a second row of cutters located behind the first row of cutters.

8. The method of claim 7, wherein the sizes, orientations and/or locations of the cutters of the second row are selected to achieve a deeper depth of cut in eccentric drilling cases than the depth of cut achievable with only the cutters of the first row.

9. The method of claim 7, wherein the cutters of the second row are offset from the radial locations of the cutters of the first row.

10. The method of claim 7, wherein the cutters of the second row do not track the cutters of the first row.

11. The method of claim 1, wherein the bottom hole assembly comprises a drill bit upon which the primary and second cutters are provided.

12. The method of claim 11, wherein the drill bit comprises a fixed cutter drill bit.

13. The method of claim 1, wherein the primary cutters and secondary cutter comprise polycrystalline diamond compacts.

14. The method of claim 1, wherein two secondary cutters are provided on the blade.

* * * * *